(12) United States Patent
Zusman

(10) Patent No.: US 12,025,633 B2
(45) Date of Patent: Jul. 2, 2024

(54) TWO-WIRE INTERFACE REFERENCE ACCELEROMETER WITH INTEGRATED MECHANICAL TRANSDUCING AND SELF-CALIBRATION CAPABILITY

(71) Applicant: Vibration Measurement Solutions, Inc., Houston, TX (US)

(72) Inventor: George V. Zusman, Houston, TX (US)

(73) Assignee: Vibration Measurement Solutions, Inc., Houston, TX (US)

( * ) Notice: Subject to any disclaimer, the term of this patent is extended or adjusted under 35 U.S.C. 154(b) by 255 days.

(21) Appl. No.: 17/652,526

(22) Filed: Feb. 25, 2022

(65) Prior Publication Data

US 2023/0273235 A1    Aug. 31, 2023

(51) Int. Cl.
  *G01P 15/125*    (2006.01)
  *G01P 15/097*    (2006.01)
  (Continued)

(52) U.S. Cl.
  CPC .......... *G01P 15/125* (2013.01); *G01P 15/097* (2013.01); *G01P 15/123* (2013.01);
  (Continued)

(58) Field of Classification Search
  CPC .... G01P 15/125; G01P 15/097; G01P 15/123; G01P 21/00; G01D 1/16; G01D 5/24476; G01R 1/30
  See application file for complete search history.

(56) References Cited

U.S. PATENT DOCUMENTS

| | | | |
|---|---|---|---|
| 8,179,121 B2 | 5/2012 | Hynd et al. | |
| 11,533,568 B1 * | 12/2022 | Du | G01H 11/08 |
| 11,743,656 B2 * | 8/2023 | Krajewski | H04R 17/10 |
| | | | 381/114 |

FOREIGN PATENT DOCUMENTS

WO   WO-2008003628 A1 *   1/2008   ............. G01D 21/00

OTHER PUBLICATIONS

Bono, "How Do I Calibrate DC Response Accelerometers? | Calibration", The Modal Shop Inc., at least as early as Feb. 24, 2022, 3 pages.

(Continued)

*Primary Examiner* — Elias Desta
(74) *Attorney, Agent, or Firm* — Walter W. Duft

(57) ABSTRACT

A two-wire reference accelerometer includes integrated mechanical transducing and self-calibration capability based on gravity only. The reference accelerometer includes an external two-wire connector and an internal three-wire transducer that responds to both steady-state acceleration and time-varying accelerations by producing a modulated transducer output signal having a steady-state waveform when the transducer senses steady state acceleration and a time-varying waveform when the transducer senses time-varying accelerations. A signal conditioning circuit conditions the transducer output signal and applies it to the two-wire electrical connector as a modulated reference accelerometer output signal. The transducer and the signal conditioning circuit can operate without modification in either a DUT calibration mode or a self-calibration mode. The self-calibration mode determines the 1 g output sensitivity of the reference accelerometer from first and second readings of the reference accelerometer output signal taken while the reference accelerometer rests on a non-accelerating surface in respective non-inverted and inverted orientations.

20 Claims, 3 Drawing Sheets

(51) Int. Cl.
  G01P 15/12 (2006.01)
  G01P 21/00 (2006.01)
  G01D 1/16 (2006.01)
  G01D 5/244 (2006.01)
  G01R 1/30 (2006.01)

(52) U.S. Cl.
  CPC .............. G01P 21/00 (2013.01); *G01D 1/16* (2013.01); *G01D 5/24476* (2013.01); *G01R 1/30* (2013.01)

(56) References Cited

OTHER PUBLICATIONS

PCB Piezotronics Inc., "Model 3711B1110G DC Response Accelerometer Installation and Operating Manual", PCB Piezotronics Inc., at least as early as Feb. 24, 2022, 11 pages.

Dytran Instruments, Inc., "Back-to-Back Accelerometer Calibration", Dytran Instruments, Inc., at least as early as Feb. 24, 2022, 3 pages.

Garcia et al., "A Low-Cost Calibration Method for Low-Cost MEMS Accelerometers Based on 3D Printing", Sensors, Nov. 12, 2020, 19 pages.

Timmons, "The Basics of Accelerometer Calibration", The Modal Shop, PCP Piezotronics Inc., Apr. 1, 2019, 30 pages.

Vogler, "Calibration of Accelerometer Vibration Sensitivity by Reference" College of Engineering—Department of ECE, Apr. 5, 2015, 10 pages.

Dytran Instruments, Inc., "Introduction to LIVM Accelerometers", Dytran Instruments, Inc., at least as early as Feb. 24, 2022, 3 pages.

zetlab.com, "ICP/IEPE technology, what is ICP IEPE sensors and their connection", <https://zetlab.com/en/support/vibration-analysis-and-acoustics/accelerometers-general-information/what-is-icp-iepe-sensors-and-their-connection/>, Zetlab, at least as early as Feb. 24, 2022, 3 pages.

Davis, "Pruftechnik CLD Accelerometer Calibration", The Modal Shop, Inc., at least as early as Feb. 24, 2022, 2 pages.

Jonscher, "Very low-frequency IEPE accelerometer calibration and application to a wind energy structure", European Academy of Wind Energy, <https://doi.org/10.5194/wes-2021-89>, Sep. 13, 2021, 25 pages.

TE Connectivity, "Choosing the Right Type of Accelerometer", Measurement Specialties, Inc., Jul. 1, 2017, 6 pages.

Wikipedia, "Common Collector", Wikepedia, <https://en.wikipedia.org/wiki/Common_collector>, Oct. 29, 2021, 6 pages.

Electronics Tutorials, "Differential Amplifier—The Voltage Subtractor", <https://www.electronics-tutorials.ws/opamp/opamp_5.html>, at least as early as Feb. 24, 2022, 6 pages.

* cited by examiner

TWO-WIRE INTERFACE REFERENCE ACCELEROMETER WITH INTEGRATED MECHANICAL TRANSDUCING AND SELF-CALIBRATION CAPABILITY

BACKGROUND

1. Field

The present disclosure relates to line drive accelerometers that utilize two-wire electronics interfaces for both power input and data output. More particularly, the disclosure is directed to a line drive reference accelerometer that can be used for back-to-back calibration of a line drive test accelerometer.

2. Description of the Prior Art

By way of background, accelerometers have long been used as sensors to measure axial vibrations, shock loads, and other operational characteristics of machines such as engines, motors, pumps, etc. In many cases, the machine on which the accelerometer is installed is remote from the monitoring equipment that evaluates the sensor output. To overcome the noise and interference inherent in such environments, line drive accelerometers have been developed that combine a piezoelectric or other AC response transducer and a built-in preamplifier that transforms the required three wire interface (power, signal and common) into a two wire voltage or current output signal where the AC vibration signal is presented together with or over the DC bias. A two-wire interface and associated two-wire cable (such as a coaxial cable) connects the accelerometer to a remote constant current or constant voltage power source for power input, and to a remote data acquisition circuit for signal output.

In some line drive accelerometer designs, the device is powered by a constant current power source and the device's output is a modulated bias voltage signal. IEPE (Integrated Electronics Piezo-Electric) accelerometers operate this manner. In other line drive accelerometer designs, the device is powered by a constant voltage power source and the device's output is a modulated bias current signal. CLD (Current Line Drive) accelerometers use this approach.

In order to produce accurate acceleration data, care must be taken to ensure that a line drive accelerometer remains properly calibrated. Calibration ensures that the device's sensitivity to acceleration (e.g., in millivolts/g or microamperes/g, where "g" is the Newtonian gravitational constant) is correctly rated at various frequencies of interest. Line drive accelerometer calibration is often performed using a back-to-back technique wherein the accelerometer device-under-test (DUT) is mounted "back-to-back" with a certified reference accelerometer of known sensitivity that is also of the line drive type. The reference accelerometer has two mounting surfaces. A lower surface attaches to a shake table armature and an upper surface mounts the DUT accelerometer. With this back-to-back arrangement, the reference accelerometer and the DUT accelerometer will each trigger an output in relation to the same applied acceleration. During calibration, the reference accelerometer and the DUT sensor are simultaneously vibrated at frequencies of interest. At each frequency, the vibration amplitude is set and vibration amplitude measurements are obtained from both the reference accelerometer and the DUT sensor. The output sensitivity of the DUT accelerometer $S_{DUT}$ may be determined based on the known output sensitivity $S_{REF}$ of the reference accelerometer and the measured amplitude readings (e.g., in millivolts or microamperes) from each accelerometer. For example, if both accelerometers are of the constant-current-input/modulated-voltage-output type, the measured output may be denominated $V_{REF}$ for the reference accelerometer and $V_{DUT}$ for the test accelerometer. The test accelerometer's output sensitivity $S_{DUT}$ may be calculated using the relationship $S_{DUT}=S_{REF}(V_{DUT}/V_{REF})$.

Using the foregoing back-to-back calibration technique requires that the reference accelerometer itself be maintained in a known calibration state. This is typically accomplished by having the reference accelerometer regularly calibrated by a NIST-certified calibration station or at a certified calibration laboratory. Unfortunately, this reduces the convenience of the back-to-back calibration technique.

It is to improvements in line drive accelerometer technology that the present disclosure is directed. In particular, a two-wire line drive reference accelerometer is proposed that provides self-calibration capability based on gravity by direct and reverse bias measurements where the same transducer and electronic components of the reference accelerometer are used for both self-calibration and normal back-to-back DUT accelerometer calibration operations.

SUMMARY

A two-wire reference accelerometer includes integrated mechanical transducing and self-calibration capability based on gravity only. The reference accelerometer includes a main body having a main axis. The main body includes a first main body portion configured for coupling to a vibration exciter operable to impart vibration energy to the reference accelerometer along the main axis, and a second main body portion configured for coupling to a two-wire test accelerometer to be calibrated as a device-under-test (DUT) using the reference accelerometer. The second main body portion is configured to impart the vibration energy received from the vibration exciter to the test accelerometer along the main axis.

A two-wire electrical connector exposed externally on the main body provides a two-wire interface between the reference accelerometer and a two-wire electrical cable that is connectable to the two-wire electrical connector. The two-wire electrical connector includes a common terminal and a power/signal terminal. The common terminal is connectable to a first wire of the two-wire cable that provides a common pathway. The power/signal terminal is connectable to a second wire of the two-wire cable that provides a power/signal pathway to deliver input power to the reference accelerometer from a power source and to deliver a reference accelerometer output signal from the reference accelerometer to a data acquisition system.

A three-wire transducer within the main body is responsive to both steady-state acceleration and time-varying accelerations. The transducer has a transducer power input, a transducer common, and a transducer signal output operable to produce a modulated transducer output signal having a steady-state transducer waveform when the transducer senses steady state acceleration and a time-varying transducer waveform when the transducer senses time-varying accelerations.

A signal conditioning circuit within the main body is operable to condition the transducer output signal and apply it to the two-wire electrical connector as a modulated reference accelerometer output signal that is proportional to the modulated transducer output signal. The transducer and the signal conditioning circuit are operable without modification in either a DUT calibration mode or a self-calibration mode of the reference accelerometer.

The DUT calibration mode of the reference accelerometer includes the first main body portion being coupled to a vibration exciter operable to impart vibration energy to the reference accelerometer along the main axis, and the second main body portion being coupled to a two-wire test accelerometer to be calibrated as a device-under-test using the reference accelerometer. The resultant reference accelerometer output signal represents time-varying accelerations sensed by the transducer in response to the vibration energy imparted by the vibration exciter.

The self-calibration mode of the reference accelerometer includes the first main body portion being placed on a non-accelerating surface and the resultant reference accelerometer output signal representing a +1 g reference accelerometer sensitivity parameter $S_{REF1}$, and the second main body portion being placed on a non-accelerating surface and the resultant reference accelerometer output signal representing a −1 g reference accelerometer sensitivity parameter $S_{REF2}$. An overall 1 g reference accelerometer output sensitivity $S_{REF}$ is represented by the relationship $S_{REF}=(S_{REF1}-S_{REF2})/2$.

BRIEF DESCRIPTION OF THE DRAWINGS

The foregoing and other features and advantages will be apparent from the following more particular description of example embodiments, as illustrated in the accompanying Drawings.

DETAILED DESCRIPTION OF EXAMPLE EMBODIMENTS

Figure 1:
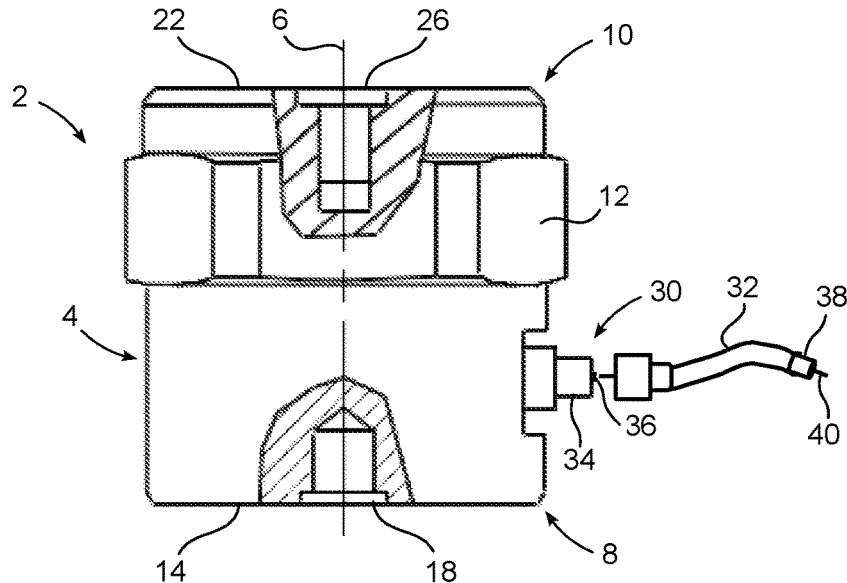
FIG. 1 is a side elevation view with partial cross-sectional aspects showing a line drive back-to-back reference accelerometer constructed in accordance with an embodiment of the present disclosure.

Turning now to the drawing figures, which are not necessarily to scale, like reference numbers will be used to represent like elements in all of the several views. FIG. 1 illustrates a line drive back-to-back reference accelerometer 2 constructed according to one possible embodiment of the disclosed subject matter.

In the illustrated embodiment, the reference accelerometer 2 includes a main body 4 having a central main axis 6, a first main body portion 8, and a second main body portion 10. The main body 4, including the first main body portion 8 and the second main body portion 10, may be formed as a rigid housing of made from metal, hard plastic or other suitable material. The main body 4 may have any shape commonly used for back-to-back reference accelerometers, with the generally cylindrical configuration shown in FIG. 1 being typical. As is also typical of back-to-back reference accelerometers, the main body 4 may include one or non-cylindrical features, such as a multi-sided flange 12 of hexagonal or other shape for engagement by a wrench or other tool.

The first main body portion 8 includes a vibration table mounting surface 14 configured for coupling to a vibration table or other vibration exciter 16 (see FIG. 3) that is operable to impart vibration energy to the reference accelerometer 2 along the main axis 6. A threaded bore 18 may be provided on the first main body portion 8 that extends internally from the vibration table mounting surface 14. The threaded bore 18 receives one end of a threaded stud (not shown) whose other end inserts into a threaded bore (not shown) formed in an armature 20 of the vibration exciter 16. Other coupling arrangements may also be used.

The second main body portion 10 includes a test unit mounting surface 22 configured for coupling to a two-wire test accelerometer 24 (see FIG. 3) to be calibrated as a device-under-test (DUT) using the reference accelerometer 2. A threaded bore 26 may be provided on the second main body portion 10 that extends internally from the test unit mounting surface 22. The threaded bore 26 receives one end of a threaded stud (not shown) whose other end inserts into a threaded bore (not shown) formed in a lower end surface 28 (see FIG. 3) of the test accelerometer 24. Other coupling arrangements may also be used.

A two-wire electrical connector 30, which may be implemented as a female coaxial cable connector, is exposed externally on the main body 4. The two-wire electrical connector 30 provides a two-wire interface between the reference accelerometer 2 and a two-wire electrical cable 32 that is connectable thereto. The two-wire electrical connector 30 includes a common connector 34 and a power/signal connector 36. The common connector 34 is connectable to a first wire 38 (e.g., a coaxial cable shield conductor) of the two-wire cable 32 that provides a common pathway. The power/signal connector 36 is connectable to a second wire 40 (e.g., a coaxial cable core conductor) of the two-wire cable 32 that provides a power/signal pathway. The power/signal pathway provided by the second wire 40 delivers input power to the reference accelerometer 2 from a power source (not shown) and delivers a reference accelerometer output signal from the reference accelerometer to a data acquisition system (not shown).

Figure 2:
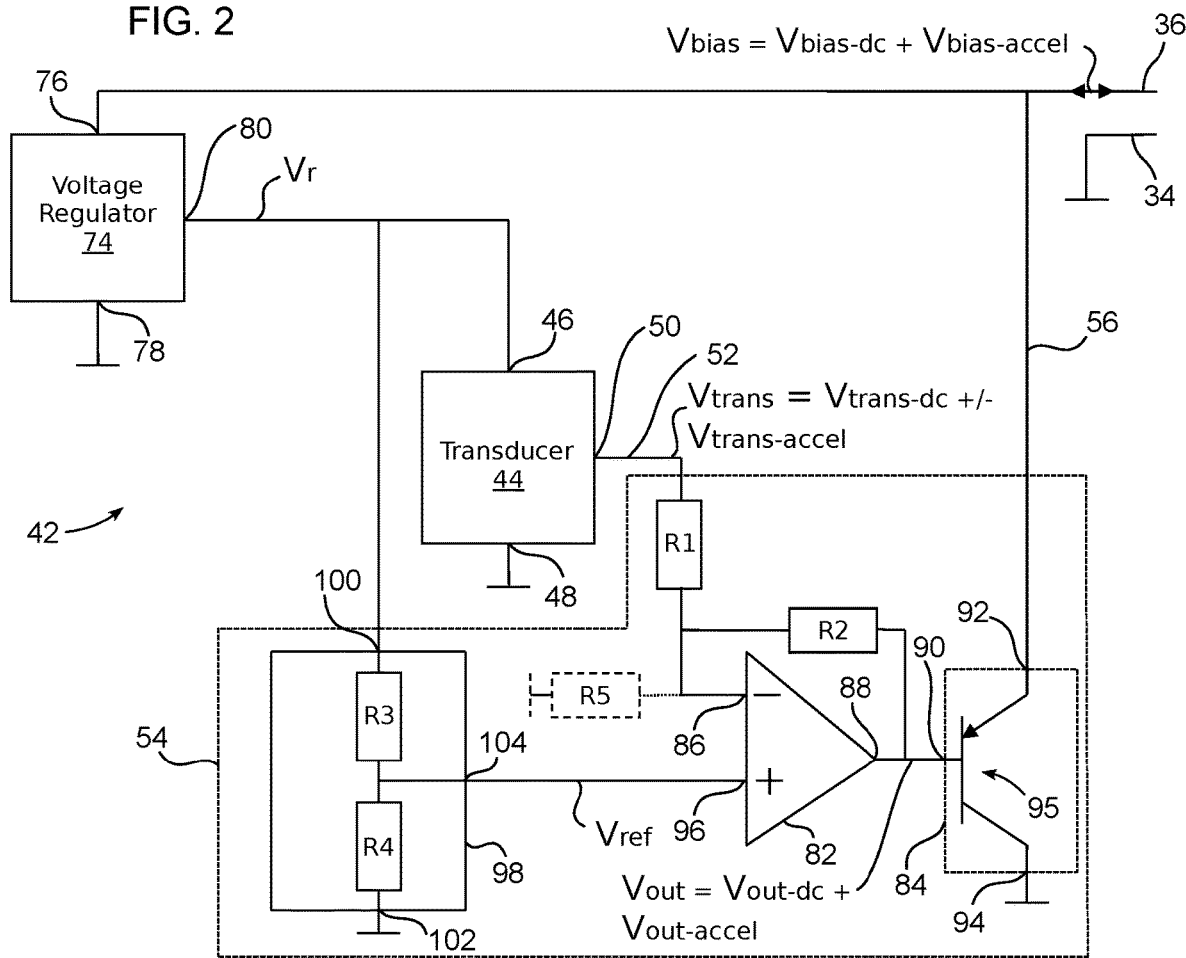
FIG. 2 is a schematic view of internal electrical components of the reference accelerometer of FIG. 1.

With additional reference to FIG. 2, the main body 4 of the reference accelerometer 6 is formed as a hollow structure having an interior chamber (not shown) that houses an onboard circuit 42 within the main body. Among the components of the onboard circuit 42 is a three-wire electromechanical transducer 44 that is responsive to both steady-state acceleration and time-varying accelerations. The transducer 44 includes a transducer power input 46, a transducer common 48, and a transducer signal output 50 operable to produce a modulated transducer output signal 52 in response to acceleration-induced perturbations of transducer. The modulated transducer output signal 52 includes a steady-state transducer waveform when the transducer senses steady state acceleration (e.g., gravity) and a time-varying transducer waveform when the transducer senses time-varying accelerations (e.g., vibrations).

The onboard circuit 42 further includes a signal conditioning circuit 54 that is operable to condition the transducer output signal 52 and apply it to the two-wire electrical connector 30 as a modulated reference accelerometer output signal 56 that is proportional to the modulated transducer output signal. Advantageously, the transducer 44 and the signal conditioning circuit 54 are operable without modification in either a back-to-back DUT calibration mode or a self-calibration mode of the reference accelerometer 2. As used herein, "without modification" means that no changes or adjustments to components, operating parameters or other circuit functionality are required in order for the reference accelerometer 2 to implement the above-mentioned operational modes.

Figure 3:
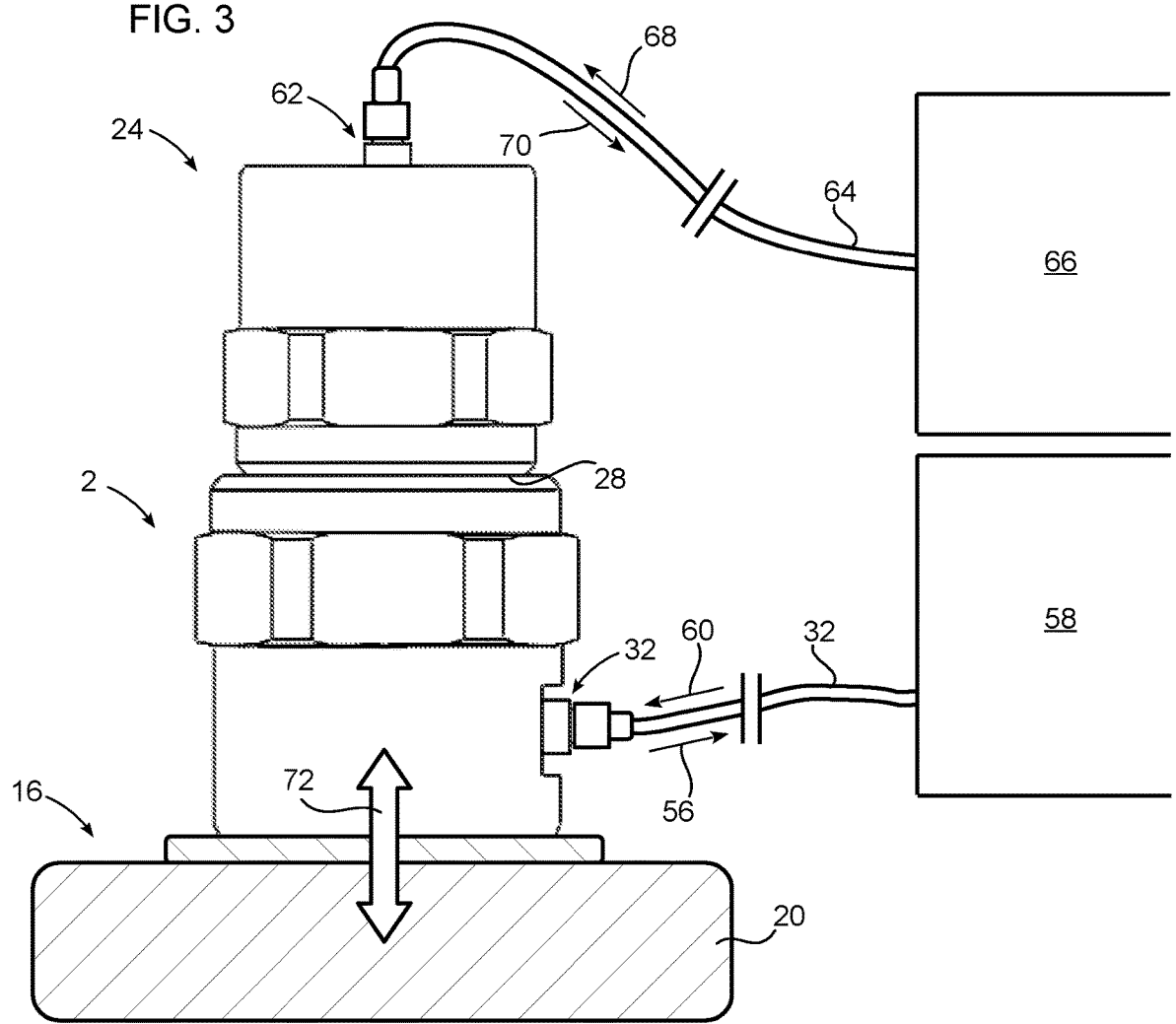
FIG. 3 is a side elevation view showing the reference accelerometer of FIG. 1 coupled to a vibration exciter and a device-under-test (DUT) for operation in a DUT calibration mode.

With additional reference to FIG. 3, the back-to-back DUT calibration mode of the reference accelerometer 2 entails the first main body portion 8 of the reference accelerometer 2 being coupled to the vibration exciter 16, and the second main body portion 10 being coupled in back-to-back relationship with the two-wire test accelerometer 24 to be calibrated as a device-under-test using the reference accelerometer. The two-wire connector 32 of the reference accelerometer 2 is connected via the two-wire cable 32 to a power source/data acquisition system 58 that delivers input power 60 to the reference accelerometer and receives the reference accelerometer output signal 56 therefrom. A two-wire connector 62 of the test accelerometer 24 is connected via its own two-wire cable 64 to a power source/data acquisition system 66 that delivers input power 68 to the test accelerometer and receives a test accelerometer output signal 70 therefrom that is proportional to a transducer output signal generated by the test accelerometer's own internal transducer (not shown).

During the back-to-back DUT calibration mode, the armature 20 of the vibration table 16 is accelerated periodically back and forth in the direction of the reference accelerometer's main axis 6. This is illustrated by the double-headed arrow 72 in FIG. 3. The resultant reference accelerometer output signal 56 represents time-varying accelerations sensed by the transducer 44 in response to the vibration energy imparted by the vibration table 16. The vibration energy imparted by the vibration table 16 to the reference accelerometer 2 is simultaneously transferred by the reference accelerometer to the test accelerometer 24 due to the tight coupling therebetween. The resultant test accelerometer output signal 70 represents time-varying accelerations sensed by the test accelerometer's own internal transducer in response to the vibration energy imparted by the vibration table 16.

The reference accelerometer 2 and the test accelerometer 24 may be vibrated at various frequencies of interest during back-to-back DUT calibration. At each frequency, the vibration amplitude is set and vibration amplitude measurements are respectively obtained by the power source/data acquisition systems 58 and 66 from the reference accelerometer 2 and the test accelerometer 24. As described in the Background section above, the output sensitivity $S_{DUT}$ of the test accelerometer 24 may be determined based on the known output sensitivity $S_{REF}$ of the reference accelerometer 2 and the measured amplitude readings (e.g., in millivolts or microamperes) from each accelerometer. For example, if both accelerometers are of the constant-current-input/modulated-voltage-output type, the measured output may be denominated $V_{REF}$ for the reference accelerometer 2 and $V_{DUT}$ for the test accelerometer 24. The test accelerometer's output sensitivity $S_{DUT}$ may be calculated using the relationship $S_{DUT}=S_{REF}(V_{DUT}/V_{REF})$.

Figure 4:
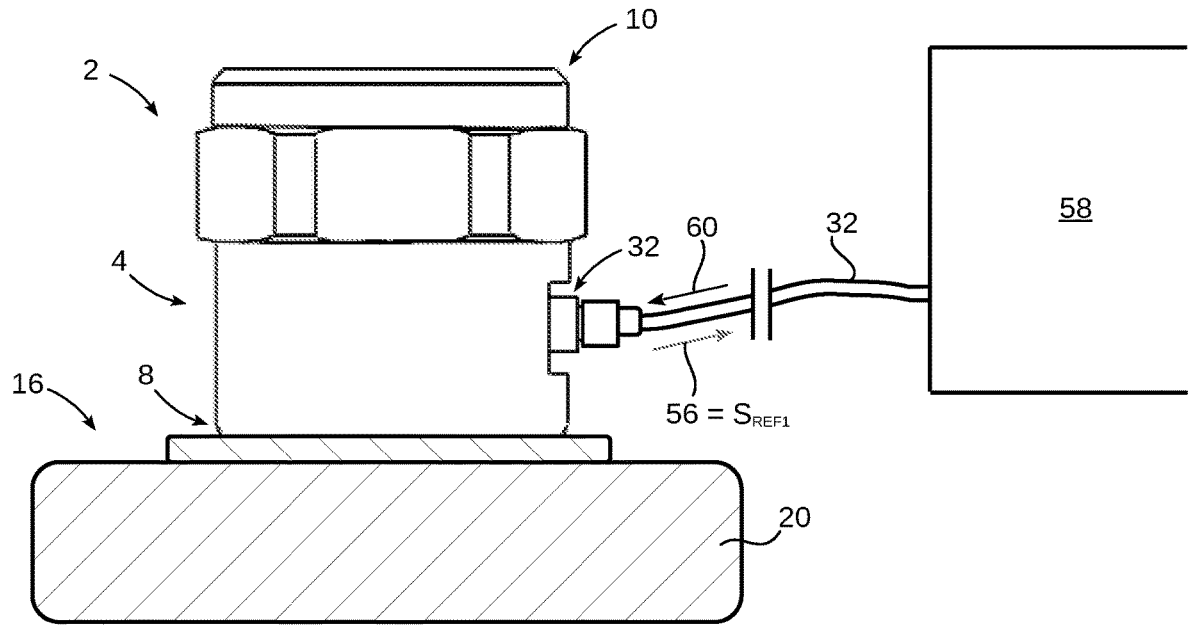
FIG. 4 is a side elevation view showing the reference accelerometer of FIG. 1 resting in a first orientation on a non-accelerating surface for operation in one stage of a self-calibration mode.
Figure 5:
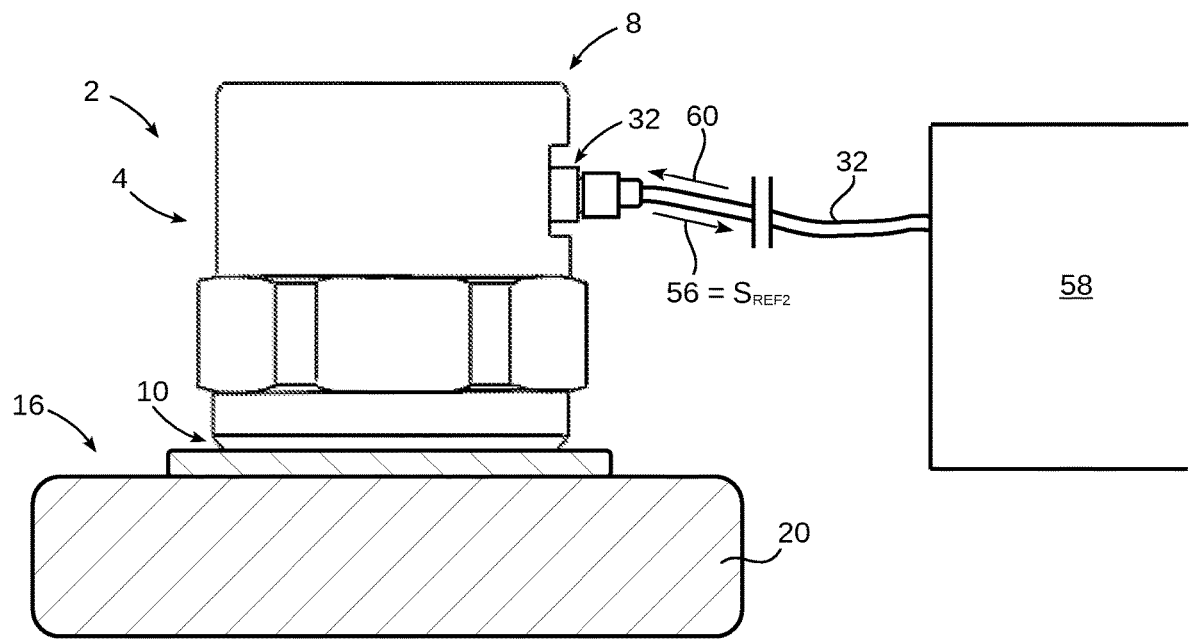
FIG. 5 is a side elevation view showing the reference accelerometer of FIG. 1 resting in an inverted second orientation on a non-accelerating surface for operation in another stage of a self-calibration mode.

The self-calibration mode of the reference accelerometer 2 is performed in two stages. Each stage entails the reference accelerometer 2 being placed on a substantially horizontal non-accelerating support surface in one of two different two orientations in which either the first main body portion 8 or the second main body portion 10 engages the non-accelerating surface. The vibration table 16 may be conveniently used as the non-accelerating surface, and this is shown in FIGS. 4 and 5. However, any stable surface of substantially horizontal orientation may be used insofar as the self-calibration is performed without any vibration energy being imparted to the reference accelerometer 2.

FIGS. 4 and 5 illustrate examples stages of the self-calibration operation. In the self-calibration stage shown in FIG. 4, the first main body portion 8 of the reference accelerometer 8 is placed on the non-accelerating surface, which is shown (by way of example only) as being provided by the armature 20 of the vibration table 16 (with the table being inactive). The resultant reference accelerometer output signal 56 represents a first 1 g reference accelerometer sensitivity parameter $S_{REF1}$. In the self-calibration stage of FIG. 5, the second main body portion 10 is placed on a non-accelerating surface (e.g., the armature 20 of vibration table 16) such that the resultant reference accelerometer output signal 56 represents a second 1 g reference accelerometer sensitivity parameter $S_{REF2}$. The reference accelerometer sensitivity parameters $S_{REF1}$ and $S_{REF2}$ respectively correspond to upright and inverted orientations of the reference accelerometer 2, with the inverted orientation being 180 degrees from the upright orientation. Once $S_{REF1}$ and $S_{REF2}$ are known, the an overall 1 g reference accelerometer output sensitivity parameter $S_{REF}$ may be determined by averaging the difference between the two parameters, such that $S_{REF}$ is represented by the relationship $S_{REF}=S_{REF1}-S_{REF2})/2$.

Returning now to FIG. 2, the transducer 44 may be selected from any of various known transducer technologies implemented by accelerometers of the type commonly referred to as DC accelerometers. Such transducers are characterized by the their ability to sense both steady-state acceleration and time-varying accelerations. Examples of this type of transducer technology include capacitive transducers and piezoresistive transducers, with capacitive transducers typically being capable of sensing accelerations from 0 Hz to 11 KHz or more, and with piezoresistive transducers typically being capable of sensing accelerations from 0 Hz to 7 KHz or more. Assuming the transducer 44 is not otherwise experiencing uniform acceleration (e.g., accelerating as a result of spatial displacement), it will appreciated that 0 Hz acceleration corresponds to gravitational acceleration, namely 1 g, where "g" represents the Newtonian gravitational constant. Both capacitive and piezoresistive transducers may be fabricated as MEMS (Micro-Electro-Mechanical-Systems) devices. Thus, as non-limiting examples, the transducer 44 may be implemented as a capacitive MEMS transducer configured for capacitive sensing of acceleration or a piezoresistive MEMS transducer configured for piezoresistive sensing of acceleration.

In an embodiment, the accelerometer output signal 56 as formed by the signal conditioning circuit 54 includes an acceleration-independent signal component and a superimposed acceleration-dependent signal component. The acceleration-independent signal component represents the output of the reference accelerometer 2 without excitation of the transducer 44. The acceleration-dependent signal component represents the output of the reference accelerometer 2 produced by acceleration-induced perturbations of the transducer 44. As described in more detail below, the signal conditioning circuit 54 may be configured for respective independent adjustment of the acceleration-independent signal component and the acceleration-dependent signal component.

In an embodiment, the reference accelerometer 2 may be configured to receive power from a constant current power source that energizes the onboard circuit 42 and causes it to produce a modulated bias voltage $V_{bias}$ representing the reference accelerometer output signal 56. In such an embodiment, the power source portion of the power source/data acquisition system 58 (see FIGS. 3-5) may serve as the constant current supply power, and the data acquisition portion of the power source/data acquisition system 58 may process $V_{bias}$. The modulated bias voltage $V_{bias}$ may represent a composite of two waveforms. The first waveform constituent of $V_{bias}$ is a DC bias voltage $V_{bias-dc}$ that represents the acceleration-independent signal component of the reference accelerometer output signal 56. The second waveform constituent of $V_{bias}$ is a superimposed acceleration-dependent bias voltage $V_{bias-accel}$ that corresponds to accelerations sensed by the transducer 44, and represents the acceleration-dependent signal component of the reference accelerometer output signal 56. As shown in FIG. 2, the modulated bias voltage $V_{bias}$ may be defined by the relationship $V_{bias}=V_{bias-dc}+V_{bias-accel}$, with $V_{bias}$ oscillating around $V_{bias-dc}$ due to the acceleration-induced variations of $V_{bias-accel}$.

The acceleration-dependent bias voltage $V_{bias-accel}$ will be present when the reference transducer 2 operates in the back-to-back DUT calibration mode of FIG. 3 and in the self-calibration mode of FIGS. 4-5. In the back-to-back DUT calibration mode, the level of the acceleration-dependent bias voltage $V_{bias-accel}$ will be a time-varying value (>0 Hz) due to the vibratory accelerations imparted to the reference transducer 2. As such, the level of the modulated bias voltage $V_{bias}$ (representing the reference accelerometer output signal 56) will likewise be time-varying. In the self-calibration mode, the level of the acceleration-dependent bias voltage $V_{bias-accel}$ will be a steady-state value (0 Hz) due to gravitational acceleration that only changes according to the orientation of the reference accelerometer 2 (i.e., upright as shown in FIG. 4 or inverted as shown in FIG. 5). As such, the level of the modulated bias voltage $V_{bias}$ (representing the reference accelerometer output signal 56) will likewise be steady-state in each reference accelerometer orientation.

During the self-calibration mode of the reference accelerometer 2, the acceleration-dependent bias voltage $V_{bias-accel}$ will increase or decrease the modulated bias voltage $V_{bias}$ according to the vertical orientation of the reference accelerometer. The modulating influence of $V_{bias-accel}$ on $V_{bias-dc}$ will be determinative of $S_{REF}$, the output sensitivity of the reference accelerometer 2. This is due to the fact that the acceleration sensed by the transducer 44 in the self-calibration mode, and the resultant acceleration-dependent bias voltage $V_{bias-accel}$, is due solely to the force of gravity.

With continuing reference to FIG. 2, the onboard circuit 42 may include a voltage regulator 74 having a voltage regulator power input 76 connected to receive power from the power/signal terminal 36 of the two-wire connector 30, a voltage regulator common 78 connected to the common terminal 34 of the two-wire connector, and a voltage regulator output 80 connected to deliver a regulated voltage $V_r$ to the transducer power input 46.

Like the reference accelerometer output signal 56, the transducer output signal 52 may itself be provided by a modulated transducer output voltage $V_{trans}$ that represents a composite of two waveforms. The first waveform constituent of $V_{trans}$ is an acceleration-independent transducer output voltage $V_{trans-dc}$ that is proportional to the regulated voltage $V_r$ received from the voltage regulator 74. By way of example $V_{trans-dc}$ may relate to $V_r$ according to the expression $V_{trans-dc}=V_r/2$. The second waveform constituent of $V_{trans}$ is an acceleration-dependent transducer output voltage $V_{trans-accel}$ that represents either the steady-state transducer waveform or the time-varying transducer waveform of the transducer 44, depending on whichever is present at the transducer signal output 50. As shown in FIG. 2, the modulated transducer output voltage $V_{trans}$ may be defined by the relationship $V_{trans}=V_{trans-dc}+V_{trans-accel}$, with $V_{trans}$ oscillating around $V_{trans-dc}$ due to the acceleration-induced variations of $V_{trans-accel}$.

It will be seen that the transducer's modulated transducer output voltage relationship $V_{trans}=V_{trans-dc}+V_{trans-accel}$, which defines the transducer output signal 52, parallels the reference accelerometer's modulated bias voltage relationship $V_{bias}=V_{bias-dc}+V_{bias-accel}$. As described in more detail below, the transducer's acceleration-independent output voltage $V_{trans-dc}$ influences the reference accelerometer's DC bias voltage $V_{trans-dc}$. Likewise, the transducer's acceleration-dependent output voltage $V_{trans-accel}$ influences the reference accelerometer's acceleration-dependent bias voltage $V_{bias-accel}$.

The acceleration-dependent transducer output voltage $V_{trans-accel}$ will be present when the reference transducer 2 operates in the back-to-back DUT calibration mode of FIG. 3 and in the self-calibration mode of FIGS. 4-5. In the back-to-back DUT calibration mode, the level of the acceleration-dependent voltage $V_{trans-accel}$ will be a time-varying value (>0 Hz) due to the vibratory accelerations imparted to the reference transducer 2. As such, the level of the modulated transducer output voltage $V_{trans}$ (representing the transducer output signal 52) will likewise be time-varying. In the self-calibration mode, the level of the acceleration-dependent transducer output voltage $V_{trans-accel}$ will be a steady-state value (0 Hz) due to gravitational acceleration that only changes according to the orientation of the reference accelerometer 2 (i.e., upright as shown in FIG. 4 or inverted as shown in FIG. 5). As such, the level of the modulated transducer output voltage $V_{trans}$ (representing the transducer output signal 52) will likewise be steady-state in each reference accelerometer orientation.

During the self-calibration mode of the reference accelerometer 2, the acceleration-dependent transducer output voltage $V_{trans-accel}$ will increase or decrease the modulated transducer output voltage $V_{trans}$ according to the vertical orientation of the reference accelerometer 2. The acceleration-dependent transducer output voltage $V_{trans-accel}$ may be considered to represent a transducer acceleration output sensitivity voltage $S_m$ when only the steady-state transducer waveform of the transducer 44 is present during the self-calibration mode of the reference accelerometer 2. Thus, in the self-calibration mode, the modulated transducer output voltage relationship $V_{trans}=V_{trans-dc}+V_{trans-accel}$ becomes $V_{trans}=V_{trans-dc}+/-S_m$, with $S_m$ being additive or subtractive depending on whether the steady-state acceleration is in a first direction or a second direction along the main axis 6 (i.e., the reference accelerometer 2 is either upright as in FIG. 4 or inverted as in FIG. 5). Recalling that the self-calibration mode of the reference accelerometer 2 involves a determination of the 1 g accelerometer sensitivity parameter $S_{REF}$, it will be appreciated that the transducer output sensitivity $S_m$ will be proportional to $S_{REF}$ in the self-calibration mode. As described in more detail below, the signal conditioning circuit 54 may be implemented in a manner that allows a proportionality ratio between $S_{REF}:S_m$ to be set independently of other operating parameters of the reference accelerometer 2, particularly the DC bias voltage $V_{bias-dc}$.

In an embodiment, the signal conditioning circuit 54 may include a voltage amplifier 82 and a voltage buffer 84. The voltage amplifier 82 includes an amplifier input 86 in electrical communication with the transducer signal output 50 that produces the transducer output signal 52 and its modulated transducer output voltage $V_{trans}$. The voltage amplifier 82 further includes an amplifier output 88 that produces a modulated amplifier output voltage $V_{out}$ having an acceleration-independent component $V_{out-dc}$ and an acceleration-dependent component $V_{out-accel}$. The voltage buffer 84 includes a voltage buffer input 90 connected to the amplifier output 88 to receive the modulated amplifier output voltage $V_{out}$. The voltage buffer 90 further includes a voltage buffer output 92 connected to the power/signal terminal 36 of the two-wire connector 30. The voltage buffer output 92 produces the modulated bias voltage $V_{bias}$ representing the reference accelerometer output signal 56. A voltage buffer common 94 is connected to the common terminal 34 of the two-wire connector 30.

In an embodiment, the voltage amplifier 82 of the signal conditioning circuit 54 may be implemented as an operational amplifier in which the amplifier input 86 is an inverting or non-inverting input to the differential amplifier, and in which there is also a second amplifier input 96. Thus configured, the voltage amplifier's output 88 will have high impedance relative to the low impedance of amplifier's driven load, which is the two-wire cable 32 that delivers the reference accelerometer output signal 56 to the power source/data acquisition system 58 (see FIGS. 3-5).

The voltage buffer 84 provides impedance matching between the high-impedance output of the voltage amplifier 82 and the amplifier's driven load. In an embodiment, the voltage buffer 84 may be implemented as a bipolar transistor wired in a common collector configuration. By way of example, FIG. 2 depicts a PNP bipolar transistor 95 wherein the transistor base provides the voltage buffer input 90, the transistor emitter provides the voltage buffer output 92, and the transistor collector provides the voltage buffer common 94. As can be seen, the transistor's base voltage is the amplifier output voltage $V_{out}$. The transistor's emitter voltage is the reference accelerometer's modulated bias voltage $V_{bias}$. If the bipolar transistor 95 is constructed as a silicon device, the base-emitter voltage differential $V_{BE}$ will be approximately −0.7 V, such that $V_{bias}=V_{out}+0.7$ V.

In an embodiment, the voltage amplifier 82 may be configured as a voltage subtractor (differential amplifier) in which the first amplifier input 86 is an inverting input of the voltage amplifier and the second amplifier input 96 is a non-inverting input of the voltage amplifier. In this embodiment, the non-inverting input 96 of the voltage amplifier 82 may be connected to a voltage reference 98 that provides a reference voltage $V_{ref}$. The voltage reference 98 includes a voltage reference input 100 connected to the voltage regulator output 80, a voltage reference common 102 connected to the common terminal 34 of the two-wire connector 30, and a voltage reference output 104 connected to deliver the reference voltage $V_{ref}$ to the non-inverting input 96 of the voltage amplifier 82.

The reference voltage $V_{ref}$ applied to the non-inverting input 96 of the voltage amplifier 82 may be proportional to the regulated voltage $V_r$ produced at the output 80 of the voltage regulator 74 according the relationship $V_{ref}=A*V_r$.

In this equation, the parameter "A" represents a first parameter of the reference accelerometer 2 whose value establishes $V_{ref}$.

The inverting input 86 of the voltage amplifier 82 is in electrical communication with the transducer signal output 50 of the transducer 44. As previously discussed, the transducer signal output 50 provides the modulated transducer output voltage $V_{trans}$ that represents the transducer output signal 52. The inverting input 86 of the voltage amplifier 82 may be associated with a second parameter B of the reference accelerometer 2. The second parameter "B" may be established by first and second resistors R1 and R2 that are mutually connected to the inverting input 86 of the voltage amplifier 82. The resistor R1 is also connected to the transducer signal output 50 to serve as an amplifier input resistor, and the resistor R2 is also connected to the amplifier output 88 to serve as an amplifier feedback resistor. In this feedback circuit, the second parameter "B" of the reference accelerometer 2 is related to the values of resistors R1 and R2 according to the relationship B=R2/R1.

In an embodiment, the voltage reference 98 may be implemented as a voltage divider provided by a third resistor R3 and a fourth resister R4 that are mutually connected to the non-inverting input 96 of the voltage amplifier 82. The resistor R3 is also connected to the voltage regulator output 80, and the resistor R4 is also connected to the voltage reference common 102. In this voltage divider circuit, the first parameter "A" of the reference accelerometer 2 is determined by the values of resistors R3 and R4 according to the voltage divider relationship A=R4/(R3+R4). The first parameter "A" thus represents a voltage reduction factor applied to the regulated voltage $V_r$ to produce the reference voltage $V_{ref}$ applied to the voltage amplifier's non-inverting input 96. As previously noted, $V_{ref}=A*V_r$.

In the illustrated voltage subtractor embodiment of the voltage amplifier 82, the amplifier output voltage $V_{out}$ may be determined from equation (1) below:

$$V_{out}=[V_r*A*(B+1)]-[V_{trans}*B] \qquad (1)$$

Equation (1) can be modified to highlight the acceleration-independent and acceleration-dependent components of $V_{out}$. This is shown in equation (2) below:

$$V_{out}=[V_r*A*(B+1)]-[V_{trans-dc}*B]-[V_{trans-accel}*B] \qquad (2)$$

In equation (2) the acceleration-independent component of $V_{out}$, namely $V_{out-dc}$, is $[V_r*A*(B+1)]-[V_{trans-dc}*B]$. This DC component of $V_{out}$ is dictated by the first and second reference accelerometer parameters "A" and "B." Insofar as the reference accelerometer's modulated bias voltage $V_{bias}$ is related to $V_{out}$ (due to the small voltage amplification provided by the voltage buffer 84), it will be seen that the DC component of $V_{bias}$, namely $V_{bias-dc}$, is likewise dictated by parameters "A" and "B." These parameters thus collectively provide a $V_{bias-dc}$ set point selector of the reference accelerometer 2, with "A" being used to establish the value of $V_{ref}$ and "B+1" being the voltage amplifier gain factor applied to $V_{ref}$.

In equation (2), the acceleration-dependent component of $V_{out}$, namely $V_{out-accel}$, is $[V_{trans-accel}*B]$. This acceleration-dependent component of $V_{out}$ is thus dictated by the second reference accelerometer parameter "B." Insofar as the reference accelerometer's modulated bias voltage $V_{bias}$ is related to $V_{out}$ (due to the small voltage amplification provided by the voltage buffer 84), it will be seen that the acceleration-dependent component of $V_{bias}$, namely, $V_{bias-accel}$, is likewise dictated by parameter "B." The parameter "B" represents the voltage amplifier gain factor applied to the acceleration-dependent transducer output voltage $V_{trans-accel}$ to obtain the acceleration-dependent amplifier output voltage $V_{out-accel}$ according to the relationship $B=V_{out-accel}/V_{trans-accel}$ Recall further that in the self-calibration mode of the reference accelerometer 2, $V_{bias-accel}$ corresponds to $S_{REF}$, the output sensitivity of the reference accelerometer 2, and $V_{trans-accel}$ corresponds to $S_m$, the output sensitivity of the transducer 44. The parameter "B" thus represents the voltage amplifier gain factor applied to $S_m$ to obtain $S_{REF}$ according to the relationship $B=S_{REF}/S_m$. The parameter "B" therefore represents a voltage amplifier transducer sensitivity gain factor, and serves as an exclusive sensitivity set point selector of the reference accelerometer 2.

In view of the foregoing, it will be seen that the reference accelerometer's DC bias voltage $V_{bias-dc}$ and the reference accelerometer's 1 g sensitivity $S_{REF}$ can be adjusted independently of each other by way of the first and second parameters "A" and "B" of the reference accelerometer 2. The value of these parameters, in turn, may be established via resistors R1, R2, R3 and R4, with A=R4/(R3+R4) and B=R2/R1, as previously noted.

In the design of a practical implementation of the onboard circuit 42, a desired value for the DC bias voltage $V_{bias-dc}$ may be selected, and a voltage regulator 74 may be chosen that produces a desired value of $V_r$. For example, a suitable DC bias voltage range may be 10-12V and a suitable voltage regulator output voltage may be 3-5V. Thus, a DC bias voltage of $V_{bias-dc}$=10V may be selected, and a voltage regulator 74 may be chosen such that $V_r$=3.3V. A transducer 44 may also be chosen that produces a known DC transducer voltage output $V_{trans-dc}$, and has a known output sensitivity $S_m$ (i.e., $V_{trans-accel}$ at 1 g acceleration). For example, a transducer 44 may be chosen such that $V_{trans-dc}$=$V_r$/2=1.65V and $S_m$=25 mV/g. Assuming the voltage buffer 84 is a silicon bipolar PNP transistor arranged in a common collector configuration as shown in FIG. 2, the approximate relationship $V_{bias}$=$V_{out}$+0.7V will hold. The design state of the onboard circuit 42 will thus be as follows:

Reference accelerometer DC bias voltage $V_{bias-dc}$ (10V)= $V_{out-dc}$+0.7V

Voltage regulator output $V_r$=3.3V

Transducer acceleration-independent output voltage $V_{trans-dc}$=$V_r$/2=1.65V

A=R4/(R3+R4)

B=R2/R1=$S_{REF}/S_m$

In an embodiment, the value of the first parameter "A" may be calculated after first selecting values for resistors R1 and R2 that will set the second parameter "B" to a value that will result in a desired amplification of the transducer output sensitivity $S_m$ according to the relationships B=R2/R1=$S_{REF}/S_m$. For example, if the transducer output sensitivity $S_m$ is 25 mV, choosing resistors R1 and R2 such that B=4 will provide a reference accelerometer output sensitivity $S_{REF}$ of 100 mV.

The value of the first parameter "A" may then be determined from $V_{bias}$, $V_r$, and "B" using a modified version of equation (2) in which it is assumed that there is no acceleration applied to the transducer 44, such that $V_{trans-accel}$=0 and $V_{trans}$=$V_{trans-dc}$=$V_r$/2. If $V_{out}$ in equation (2) is also replaced with $V_{bias}$−0.7, equation (2) becomes equation (3) below:

$$V_{out}=[V_{bias}-0.7]=[V_r*A*(B+1)]-[V_r/2*B] \quad (3)$$

Rearranging equation (3) to solve for "A" results in equation (4) below:

$$A=[2*(V_{bias}-0.7)+V_r \times B]/[2*V_r*(B+1)] \quad (4)$$

Once the value of "A" has been calculated from equation (4), values of resistors R3 and R4 may be chosen to obtain the calculated value of "A" according the relationship A=R4/(R3+R4). Design Example 1 below represents a practical implementation of the above-described design process.

Design Example 1

Assume that the voltage regulator 74 delivers a voltage regulator output voltage $V_r$ of 3.3 V, and that the transducer 44 is a capacitive MEM transducer having an output sensitivity $S_m$ of 25 mV/g and a DC output voltage $V_{trans-dc}$ of $V_r$/2=1.65V. Assume further that the design goal is to provide a reference accelerometer output sensitivity $S_{REF}$ of 100 mV/g and a reference accelerometer bias voltage without gravity of $V_{bias}$=$V_{bias-dc}$=10V. Selecting the second parameter "B" to have a value of B=4 will provide the desired $S_{REF}$ value of 100 mV/g when $S_m$ is 25 mV/g. Insofar as B=R2/R1, the values of resistors R1 and R2 may now be chosen. For example, let R1=250 KΩ and R2=1 MΩ.

It is then possible to calculate the value of the first parameter "A" using equation (4), with $V_{bias}$−0.7=9.3 V, Vr=3.3V, and B=4. The result is A=[(2*9.3)+(3.3*4)]/[2*3.3*(4+1)]=31.8/33=0.9636. The values of resistors R3 and R4 may now be chosen based on A=0.9636. For example, let R3=3.82KΩ and R4=101KΩ. Self-calibration of the reference accelerometer 2 may now be performed.

In a first self-calibration stage, the reference accelerometer bias voltage $V_{bias}$ may be determined for the zero acceleration condition of the reference accelerometer 2 to determine $V_{bias-dc}$. This calculation begins with applying equation (1) to calculate the amplifier output voltage $V_{out}$. For convenience, equation (1) is reiterated below.

$$V_{out}=[V_r*A*(B+1)]-[V_{trans}*B] \quad (1)$$

The values needed for this calculation are $V_r$=3.3V, $V_{trans}$=$V_{trans-dc}$=$V_r$/2=1.65V, A=0.9636, and B=4. Plugging these values into equation (1) to calculate the amplifier output voltage $V_{out}$ gives $V_{out}$=[3.3*0.9636*(4+1)]−[1.65*4]=15.8994−6.6=9.3V. Insofar as $V_{bias}$=$V_{out}$+0.7V, the value of the reference accelerometer bias voltage $V_{bias}$ for the zero acceleration condition (i.e., $V_{bias-dc}$), will be 9.3+0.7=10V.

In a second self-calibration stage, the reference accelerometer 2 is placed in a first vertical orientation on a non-accelerating surface. Assume that the acceleration due to gravity will add the transducer's 1 g sensitivity voltage $S_m$ (25 mV) to the transducer output signal 52, such that $V_{trans}$=$V_{trans-dc}$+$S_m$. In this first orientation, the values needed for the equation (1) calculation are $V_r$=3.3V, $V_{trans}$=1.65+0.025V=1.675V, A=0.9636, and B=4. Plugging these values into equation (1) to calculate the amplifier output voltage $V_{out}$ gives $V_{out}$ =[3.3*0.9636*(4+1)]−[1.675*4]=15.8994−6.7=9.2V. Insofar as $V_{bias}$=$V_{out}$+0.7V, the value of the reference accelerometer bias voltage $V_{bias}$ for this orientation of the reference accelerometer 2, which may be designated as $S_{REF2}$, will be 9.2+0.7=9.9V.

In a third self-calibration stage, the reference accelerometer 2 is placed in a second vertical orientation on the non-accelerating surface that is 180 degrees from the first vertical orientation. Assume that the acceleration due to gravity will subtract the transducer's 1 g sensitivity voltage $S_m$ (25 mV) from the transducer output signal 52, such that $V_{trans}$=$V_{trans-dc}$−$S_m$. In this second orientation, the values needed for the equation (1) calculation are $V_r$=3.3V, $V_{trans}$=1.65−0.025V=1.625V, A=0.9636, and B=4. Plugging these values into equation (1) to calculate the amplifier output voltage $V_{out}$ gives $V_{out}$=[3.3*0.9636*(4+1)]−[1.625*4]=15.8994−6.5=9.4V. Insofar as $V_{bias}$=$V_{out}$+0.7V, the value of the reference accelerometer bias voltage $V_{bias}$ for this orientation of the reference accelerometer 2, which may be designated as $S_{REF1}$, will be 9.4+0.7=10.1V.

In a fourth self-calibration stage, the calculated values of $S_{REF1}$=10.1V and $S_{REF2}$=9.9V are used to determine the reference accelerometer output sensitivity $S_{REF}$ according to the relationship $S_{REF}$=($S_{REF1}$−$S_{REF2}$)/2. In this example $S_{REF}$=(10.1V−9.9V)/2=100 mV, which is the desired reference accelerometer output sensitivity value.

In an embodiment, the signal conditioning circuit 54 may be modified to connect a fifth resistor R5 between the inverting input 86 of the voltage amplifier 82 and the common terminal 34 of the two-wire connector 30. This will give rise to a third parameter "C" of the reference accelerometer 2, where C=R2/R5. The parameter "C" influences the DC bias voltage $V_{bias-dc}$ but will not impact the first parameter "B" or the reference accelerometer output sensitivity $S_{REF}$ for vibrations within the frequency range of the transducer 44. When the resistor R5 is added, equation (1) for calculating $V_{out}$ is modified to become equation (5) below:

$$V_{out}=[V_r*A*(C+B+1)]-[V_{trans}*B] \quad (5)$$

Equation (3) for calculating $V_{out}$ in terms of $V_{bias-dc}$−0.7 is modified to become equation (6) below:

$$V_{out}=[V_{bias-dc}-0.7]=[V_r*A*(C+B+1)]-[V_r/2*B] \quad (6)$$

Rearranging equation (6) to solve for "A" results in equation (7) below:

$$A=[2*(V_{bias-dc}-0.7)+V_r \times B]/[2*Vr*(C+B+1)] \quad (7)$$

Without resistor R5 there is a limitation on the maximum bias voltage $V_{bias-dc}$ that can be produced by the reference accelerometer 2 due to the value of parameter "A" being limited to A<=1. When equation (3) is applied with A=1 and rearranged to solve for $V_{bias-dc}$, it will be found that $V_{bias-dc}$ is limited to $V_{bias-dc}$≤[$V_r$*(B/2+1)]+0.7. Thus, if $V_r$=3.3V and B=4 as in Design Example 1, the maximum value of $V_{bias}$ when A=1 will be $V_{bias}$=3.3 (4/2+1)+0.7=(3.3*3)+0.7=10.6V. Adding the resistor R5 allows a higher bias voltage $V_{bias}$ to be obtained. A higher value of $V_{bias}$ may be desirable if it is anticipated that the vibration-induced excursions $V_{bias-accel}$ during back-to-back DUT calibration could exceed $V_{bias-dc}$. When $V_{bias-accel}$ is subtractive, the lower end of the dynamic range of $V_{bias}$ could be exceeded, swinging $V_{bias}$ to the voltage of the circuit common and causing negative overload of the accelerometer signal output 56. Design Example 2 below illustrates the use of resistor R5 to increase $V_{bias}$.

Design Example 2

Assume that the transducer 44 the voltage regulator 74 are the same as in Design Example 1, such that $V_r$=3.3V and V of $V_r$/2=1.65V. Adding resistor R5 to the signal conditioning circuit 54 provides the additional parameter C=R2/R5. Assume further that the design goal is to provide a reference accelerometer output sensitivity $S_{REF}$ of 100 mV/g and a reference accelerometer bias voltage without gravity of greater than 10.6V. For example, the approximate target bias voltage may be chosen as $V_{bias}$=$V_{bias-dc}$=12V. Selecting a second parameter value of B=4 will provide the desired $S_{REF}$ value of 100 mV/g when $S_m$ is 25 mV/g. Insofar as B=R2/R1, the values of resistors R1 and R2 may be chosen as in Design Example 1, with R1=250 KΩ and R2=1 MΩ. Assuming the parameter "C" is selected so that C=1, the value of R5 may be chosen to be the same as R2 (i.e., 1 MΩ) given that C=R2/R5=1 requires that R2=R5.

It is now possible to calculate the value of the first parameter A using equation (7), with $V_{bias}$−0.7=11.3 V, Vr=3.3V, B=4, and C=1. The result is A=[(2*11.3)+(3.3*4)]/[2*3.3*(1+4+1)]=35.8/39.6=0.9040404. The values of resistors R3 and R4 may now be chosen based on A=0.9040404. For example, let R3=19.32KΩ and R4=182KΩ. Self-calibration of the reference accelerometer 2 may now be performed.

In a first self-calibration stage, the reference accelerometer bias voltage $V_{bias}$ may be determined for the zero acceleration condition of the reference accelerometer 2 to determine $V_{bias-dc}$. This calculation begins with applying equation (5) to calculate the amplifier output voltage $V_{out}$. For convenience, equation (5) is reiterated below.

$$V_{out}=[V_r*A*(C+B+1)]-[V_{trans}*B] \quad (5)$$

The values needed for this calculation are $V_r$=3.3V, $V_{trans}$=$V_r$/2=1.65V, A=0.9, B=4, and C=1. Plugging these values into equation (5) to calculate the amplifier output voltage $V_{out}$ gives $V_{out}$=[3.3*0.9040404*(1+4+1)]−[1.65*4]= 17.9−6.6=11.3V. Insofar as $V_{bias}$=$V_{out}$+0.7V, the value of $V_{bias}$ for the zero acceleration condition, which is $V_{bias-dc}$, will be 11.3+0.7=12V.

In a second self-calibration stage, the reference accelerometer 2 is placed in a first vertical orientation on a non-accelerating surface. Assume that the acceleration due to gravity will add the transducer's 1 g sensitivity voltage $S_m$ (25 mV) to the transducer output signal 52, such that $V_{trans}$=$V_{trans-dc}$+$S_m$. In this first orientation, the values needed for the equation (5) calculation are $V_r$=3.3V, $V_{trans}$=1.65+0.025V=1.675V, A=0.9, B=4, and C=1. Plugging these values into equation (5) to calculate the amplifier output voltage $V_{out}$ gives $V_{out}$=[3.3*0.9*(1+4+1)]−[1.675*4]=17.9−6.7=11.2V. Insofar as $V_{bias}$=$V_{out}$+0.7V, the value of $V_{bias}$ for this orientation of the reference accelerometer 2 which may be designated as $S_{REF2}$, will be 11.2+0.7=11.9V.

In a third self-calibration stage, the reference accelerometer 2 is placed in a second vertical orientation on the non-accelerating surface that is 180 degrees from the first vertical orientation. Assume that the acceleration due to gravity will subtract the transducer's 1 g sensitivity voltage $S_m$ (25 mV) to the transducer output signal 52, such that $V_{trans}$=$V_{trans-dc}$−$S_m$. In this second vertical position, the values needed for the equation (5) calculation are $V_r$=3.3V, $V_{trans}$=1.65−0.025V=1.625V, A=0.9, B=4, and C=1. Plugging these values into equation (5) to calculate the amplifier output voltage $V_{out}$ gives $V_{out}$=[3.3*0.9040404*(1+4+1)]−[1.625*4]=17.9−6.5=11.4V. Insofar as $V_{bias}$=$V_{out}$+0.7V, the value of $V_{bias}$ for this orientation of the reference accelerometer 2, which may be designated as $S_{REF1}$, will be 11.4+0.7=12.1V.

In a fourth self-calibration stage, the calculated values of $S_{REF1}$=12.1V and $S_{REF2}$=11.9V are used to determine the reference accelerometer output sensitivity $S_{REF}$ according to the relationship $S_{REF}$=($S_{REF1}$−$S_{REF2}$)/2. In this example $S_{REF}$=(12.1V−11.9V)/2=100 mV, which is the desired reference accelerometer output sensitivity value.

Advantageously, following self-calibration of the reference accelerometer 2 as described above, the reference accelerometer may be used without modification of any aspect of the onboard circuit 42 to calibrate one or more test accelerometers according to the back-to-back DUT calibration mode of operation. Recalibration of the reference accelerometer 2 may be performed periodically over its lifespan. The existing requirement of having to perform reference accelerometer calibration using a NIST-certified calibration station or at a certified calibration laboratory has been eliminated. Instead, the calibration is self-referential and may be performed without the need for external calibration resources. In the event that the transducer sensitivity $S_m$ changes over time, the above-described self-calibration operation will reflect this change by proportionately adjusting the value of the reference accelerometer output sensitivity $S_{REF}$. Performing periodic self-calibration of the reference accelerometer 2 will thus ensure that $S_{REF}$ remains accurate. Advantageously, the simplicity and ease of self-calibration allows this operation to be performed at any time, as often as desired.

Accordingly, a two-wire reference accelerometer with integrated mechanical transducing and self-calibration capability has been disclosed. Reference in the present disclosure to an "embodiment" means that a particular feature, structure or characteristic described in connection with the embodiment may be included in at least one embodiment of the disclosed device. Thus, the appearances of the term "embodiment" in various places throughout the specification are not necessarily all referring to the same embodiment.

For purposes of explanation, specific configurations and details have been set forth herein in order to provide a thorough understanding of the present invention. However, it will be apparent to one of ordinary skill in the art that embodiments of the present invention may be practiced without the specific details presented herein. Furthermore, well-known features may have been omitted or simplified in order not to obscure the present invention. Various examples have been given throughout this description. These examples are merely descriptions of specific embodiments of the invention. The scope of the claimed subject matter is not limited to the examples given.

It should also be understood that certain components shown or described as a single element could be implemented as a combination of elements, and visa versa. This is particularly the case for components of the onboard circuit 42 of the reference accelerometer 2, such as resistors R1, R2, R3 and R4 that could be each be implemented as a resistor combination instead of single resistor.

As used herein, the terms such as "upper," "lower," "top," "bottom," "vertical," "vertically," "lateral," "laterally," "inner," "outer," "outward," "inward," "front," "frontward," "forward," "rear," "rearward," "upwardly," "downwardly," "inside," "outside," "interior," "exterior," and other orientational descriptors are intended to facilitate the description of the example embodiments of the present disclosure, and are not intended to limit the structure of the example embodiments of the present disclosure to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments. Terms of rough approximation, such as "generally," are understood by those of ordinary skill to refer to a characteristic or feature of that bears resemblance to something, such that it is reasonable to draw a comparison to facilitate understanding, without requiring that the characteristic or feature be exactly the same, or even substantially the same, as the thing to which it is compared.

Although various example embodiments have been shown and described, it should be apparent that many variations and alternative embodiments could be implemented in accordance with the disclosure. It is understood, therefore, that the invention is not to be in any way limited except in accordance with the spirit of the appended claims and their equivalents.

What is claimed is:

1. A two-wire reference accelerometer with integrated mechanical transducing and self-calibration capability based on gravity only, comprising:
   a main body having a main axis;
   a first main body portion configured for coupling to a vibration exciter operable to impart vibration energy to the reference accelerometer along the main axis;
   a second main body portion configured for coupling to a two-wire test accelerometer to be calibrated as a device-under-test (DUT) using the reference accelerometer, the second main body portion being configured to impart the vibration energy received from the vibration exciter to the test accelerometer along the main axis;
   a two-wire electrical connector exposed externally on the main body providing a two-wire interface between the reference accelerometer and a two-wire electrical cable that is connectable to the two-wire electrical connector, the two-wire electrical connector including a common terminal and a power/signal terminal, the common terminal being connectable to a first wire of the two-wire cable that provides a common pathway, and the power/signal terminal being connectable to a second wire of the two-wire cable that provides a power/signal pathway to deliver input power to the reference accelerometer from a power source and to deliver a reference accelerometer output signal from the reference accelerometer to a data acquisition system;
   a three-wire transducer within the main body that is responsive to both steady-state acceleration and time-varying accelerations, the transducer having a transducer power input, a transducer common, and a transducer signal output operable to produce a modulated transducer output signal comprising a steady-state transducer waveform when the transducer senses steady state acceleration and a time-varying transducer waveform when the transducer senses time-varying accelerations;
   a signal conditioning circuit within the main body operable to condition the transducer output signal and apply it to the two-wire electrical connector as a modulated reference accelerometer output signal that is proportional to the modulated transducer output signal;
   the transducer and the signal conditioning circuit being operable without modification in either a DUT calibration mode or a self-calibration mode of the reference accelerometer;
   the DUT calibration mode comprising the first main body portion being coupled to a vibration exciter operable to impart vibration energy to the reference accelerometer along the main axis, the second main body portion being coupled to a two-wire test accelerometer to be calibrated as a device-under-test using the reference accelerometer, and with the resultant reference accelerometer output signal representing time-varying accelerations sensed by the transducer in response to the vibration energy imparted by the vibration exciter; and
   the self-calibration mode comprising the first main body portion being placed on a non-accelerating surface such that the resultant reference accelerometer output signal represents a +1 g reference accelerometer sensitivity parameter $S_{REF1}$, the second main body portion being placed on a non-accelerating surface such that the resultant reference accelerometer output signal represents a −1 g reference accelerometer sensitivity parameter $S_{REF2}$, and wherein an overall 1 g reference accelerometer output sensitivity $S_{REF}$ is represented by the relationship $S_{REF}=(S_{REF1}-S_{REF2})/2$.

2. The two-wire reference accelerometer of claim 1, wherein the transducer is selected from the group consisting of capacitive transducers and piezoresistive transducers.

3. The two-wire reference accelerometer of claim 1, wherein the transducer is configured for capacitive sensing of acceleration.

4. The two-wire reference accelerometer of claim 1, wherein the transducer comprises a MEMS (Micro-Electro-Mechanical-Systems) transducer configured for capacitive sensing of acceleration.

5. The two-wire reference accelerometer of claim 1, wherein the accelerometer output signal as formed by the signal conditioning circuit comprises an acceleration-independent DC bias signal component and a transducer-modulated acceleration-dependent signal component, and wherein the signal conditioning circuit is configured for independent adjustment of the DC bias signal component and the acceleration-dependent signal component.

6. The two-wire reference accelerometer of claim 5, wherein the reference accelerometer is configured to receive power from a constant current power source and to produce a modulated bias voltage $V_{bias}$ representing the reference accelerometer output signal, the modulated bias voltage comprising a DC bias voltage $V_{bias-dc}$ representing the acceleration-dependent signal component of the reference accelerometer output signal, and a superimposed acceleration-dependent bias voltage $V_{bias-accel}$ representing the acceleration-dependent signal component of the reference accelerometer output signal, and wherein $V_{bias-accel}$ is determinative of $S_{REF}$ when the reference accelerometer operates in the self-calibration mode.

7. The two-wire reference accelerometer 6, wherein the reference accelerometer comprises a voltage regulator having a voltage regulator power input connected to receive power from the power/signal terminal of the two-wire connector, a voltage regulator common connected to the common terminal of the two-wire connector, and a voltage regulator output connected to deliver a regulated voltage $V_r$ to the transducer power input.

8. The two-wire reference accelerometer of claim 7, wherein the transducer output signal comprises an acceleration-independent transducer output voltage $V_{trans-dc}$ proportional to the regulated voltage $V_r$ received from the voltage regulator, and an acceleration-dependent transducer output voltage $V_{trans-accel}$ proportional to either the steady-state transducer waveform or the time-varying transducer waveform, depending on whichever is present at the transducer signal output, the acceleration-dependent transducer output voltage $V_{trans-accel}$ being superimposed on the acceleration-dependent transducer output voltage $V_{trans-dc}$ to produce a modulated transducer output voltage $V_{trans}=V_{trans-dc}+/-V_{trans-accel}$, where $V_{trans-accel}$ is a positive value for accelerations in a first direction along the main axis and where $V_{trans-accel}$ is a negative value for accelerations in an opposite second direction along the main axis.

9. The two-wire reference accelerometer of claim 8, wherein the acceleration-dependent transducer output voltage $V_{trans-accel}$ comprises a transducer output sensitivity voltage $S_m$ when the steady-state transducer waveform is present, such that the modulated transducer output voltage $V_{trans}=V_{trans-dc}+/-S_m$ depending on whether the steady-state acceleration is in the first direction along the main axis or the second direction along the main axis, with $S_m$ being proportional to the reference accelerometer output sensitivity $S_{REF}$ when the reference accelerometer operates in the self-calibration mode.

10. The two-wire reference accelerometer of claim 9, wherein the signal conditioning circuit comprises a voltage amplifier and a voltage buffer, the voltage amplifier comprising an amplifier input in electrical communication with the transducer signal output that produces the modulated transducer output voltage $V_{trans}$, and an amplifier output that produces a modulated amplifier output voltage $V_{out}$, the voltage buffer having a voltage buffer input connected to the amplifier output to receive the modulated amplifier output voltage $V_{out}$, and a voltage buffer output connected to the power/signal terminal of the two-wire connector and producing the modulated bias voltage $V_{bias}$ representing the reference accelerometer output signal.

11. The two-wire reference accelerometer of claim 10, wherein the voltage amplifier of the signal conditioning circuit comprises an operational amplifier having a first amplifier input in electrical communication with the transducer signal output that produces the modulated transducer output voltage $V_{trans}$, a second amplifier input, and the amplifier output that produces the modulated amplifier output voltage $V_{out}$.

12. The two-wire reference accelerometer of claim 11, wherein the second amplifier input is in electrical communication with a voltage reference that provides a reference voltage $V_{ref}$.

13. The two-wire reference accelerometer of claim 12, wherein the operational amplifier is configured as a voltage subtractor in which the first amplifier input comprises an inverting input of the amplifier, and the second amplifier input comprises a non-inverting input of the amplifier, and wherein the modulated amplifier output voltage $V_{out}$ is proportional to $V_{ref}-V_{trans}$.

14. The two-wire reference accelerometer of claim 13, wherein the reference voltage $V_{ref}$ applied to the non-inverting input of the differential amplifier is proportional to the regulated voltage $V_r$ produced at the voltage regulator output according the relationship $V_{ref}=A*V_r$, where "A" represents a first parameter of the differential amplifier whose value influences the DC bias voltage $V_{bias-dc}$ representing the acceleration-independent signal component of the reference accelerometer output signal.

15. The two-wire reference accelerometer of claim 14, wherein the inverting input of the differential amplifier is associated with a second parameter "B" of the differential amplifier whose value influences the acceleration-dependent bias voltage $V_{bias-accel}$ representing the acceleration-dependent signal component of the accelerometer output signal, such that when the reference accelerometer operates in the self-calibration mode, "B" is determinative of the voltage level of the reference accelerometer sensitivity parameter $S_{REF}$, and thus serves as a reference accelerometer sensitivity selector, and wherein "B" in combination with "A" serves as a DC bias set point selector of the reference accelerometer for establishing the DC bias voltage $V_{bias-dc}$.

16. The two-wire reference accelerometer of claim 15 wherein the second parameter "B" is set by first and second resistors R1 and R2 mutually connected to the inverting input of the differential amplifier, with R1 also being connected to the transducer signal output as an amplifier input resistor, with R2 also being connected to the amplifier output as an amplifier feedback resistor, and with B=R2/R1.

17. The two-wire reference accelerometer of claim 16, wherein the voltage reference comprises a voltage divider that includes a third resistor R3 and a fourth resister R4 mutually connected to the non-inverting input of the differential amplifier, with R3 also being connected to the voltage regulator output and R4 also being connected to the common terminal of the two-wire connector, and with the first parameter "A" being a voltage reduction factor set by resistors R3 and R4 according to the voltage divider relationship A=R4/(R3+R4).

18. The two-wire reference accelerometer of claim 17, wherein the second parameter "A" is dependent on $V_{bias}$, $V_r$ and "B".

19. The two-wire reference accelerometer of claim 18, wherein a fifth resistor R5 is connected between the inverting input of the differential amplifier and the common terminal of the two-wire connector, and wherein the differential amplifier comprises a third gain parameter C=R2/R5 that influences the DC bias voltage $V_{bias-dc}$, and further wherein the first parameter "A" is dependent on $V_{bias}$, $V_r$, "B" and "C".

20. A calibration method for a two-wire reference accelerometer, comprising:
providing a two-wire reference accelerometer with integrated mechanical transducing and self-calibration capability based on gravity only, the reference accelerometer comprising:
a main body having a main axis;
a first main body portion configured for coupling to a vibration exciter operable to impart vibration energy to the reference accelerometer along the main axis;
a second main body portion configured for coupling to a two-wire test accelerometer to be calibrated as a device-under-test (DUT) using the reference accelerometer, the second main body portion being configured to impart the vibration energy received from the vibration exciter to the test accelerometer along the main axis;
a two-wire electrical connector exposed externally on the main body providing a two-wire interface between the reference accelerometer and a two-wire electrical cable that is connectable to the two-wire electrical connector, the two-wire electrical connector including a common terminal and a power/signal terminal, the common terminal being connectable to a first wire of the two-wire cable that provides a common pathway, and the power/signal terminal being connectable to a second wire of the two-wire cable that provides a power/signal pathway to deliver input power to the reference accelerometer from a power source and to deliver a reference accelerometer output signal from the reference accelerometer to a data acquisition system;
a three-wire transducer within the main body that is responsive to both steady-state acceleration and time-varying acceleration, the transducer having a transducer power input, a transducer common, and a transducer signal output operable to produce a modulated transducer output signal comprising a steady-state transducer waveform when the transducer senses steady state acceleration and a time-varying transducer waveform when the transducer senses time-varying accelerations;
a signal conditioning circuit within the main body operable to condition the transducer output signal and apply it to the two-wire electrical connector as a reference accelerometer output signal that is proportional to the modulated transducer output signal;
the transducer and the signal conditioning circuit being operable without modification in either a DUT calibration mode or a self-calibration mode of the reference accelerometer;
the DUT calibration mode comprising the first main body portion being coupled to a vibration exciter operable to impart vibration energy to the reference accelerometer along the main axis, the second main body portion being coupled to a two-wire test accelerometer to be calibrated as a device-under-test using the reference accelerometer, and the accelerometer signal component representing time-varying accelerations sensed by the transducer in response to the vibration energy imparted by the vibration exciter; and
the self-calibration mode comprising the first main body portion being placed on a non-accelerating surface and the accelerometer signal component being representing a +1 g reference accelerometer sensitivity parameter $S_{REF\ 1}$, the second main body portion being placed on a non-accelerating surface and the accelerometer signal component representing a −1 g reference accelerometer sensitivity parameter $S_{REF\ 2}$, and wherein an overall 1 g reference accelerometer output sensitivity $S_{REF}$ is represented by the relationship $S_{REF}=(S_{REF\ 1}-S_{REF2})/2$;
connecting the two-wire electrical connector to a two-wire electrical cable that includes a first wire providing a common pathway, and a power/signal pathway that delivers input power to the reference accelerometer from a power source and delivers a reference accelerometer output signal from the reference accelerometer to a data acquisition system that quantifies the accelerometer output signal;
implementing one stage of the self-calibration mode by placing the first main body portion of the reference accelerometer on a non-accelerating surface, and interpreting the accelerometer output signal as the +1 g reference accelerometer sensitivity parameter $S_{REF\ 1}$;
implementing another stage of the self-calibration mode by inverting the reference accelerometer and placing the second main body portion thereof on a non-accelerating surface, and interpreting the accelerometer output signal as the −1 g reference accelerometer sensitivity parameter $S_{REF\ 2}$; and
implementing another stage of the self-calibration mode by calculating the overall 1 g reference accelerometer sensitivity parameter SP of the reference accelerometer using the relationship $S_{REF}=(S_{REF\ 1}-S_{REF2})/2$.

\* \* \* \* \*